US010281491B2

(12) United States Patent
McQuade et al.

(10) Patent No.: US 10,281,491 B2
(45) Date of Patent: May 7, 2019

(54) PROBE CARD FOR TESTING SEMICONDUCTOR WAFERS

(71) Applicants: Francis T. McQuade, Hutto, TX (US); Raul Ramon Molina, IV, Hutto, TX (US); Michael Chrastecky, Hutto, TX (US)

(72) Inventors: Francis T. McQuade, Hutto, TX (US); Raul Ramon Molina, IV, Hutto, TX (US); Michael Chrastecky, Hutto, TX (US)

(73) Assignee: TRANSLARITY, INC., Fremont, CA (US)

( * ) Notice: Subject to any disclaimer, the term of this patent is extended or adjusted under 35 U.S.C. 154(b) by 34 days.

(21) Appl. No.: 15/364,470

(22) Filed: Nov. 30, 2016

(65) Prior Publication Data
US 2018/0149675 A1 May 31, 2018

(51) Int. Cl.
| | | |
|---|---|---|
| *G01R 31/20* | (2006.01) | |
| *G01R 1/073* | (2006.01) | |
| *G01R 3/00* | (2006.01) | |
| *G01R 31/26* | (2014.01) | |
| *G01R 31/28* | (2006.01) | |

(52) U.S. Cl.
CPC ..... *G01R 1/07342* (2013.01); *G01R 1/07357* (2013.01); *G01R 1/07371* (2013.01); *G01R 3/00* (2013.01); *G01R 31/2601* (2013.01); *G01R 31/2891* (2013.01)

(58) Field of Classification Search
CPC .............. G01R 1/0408; G01R 31/2601; G01R 31/2891; G01R 31/2834; G01R 31/2887

USPC ........ 324/71, 378, 403, 415, 425, 500, 537, 324/750.16, 750.25
See application file for complete search history.

(56) References Cited

U.S. PATENT DOCUMENTS

| | | | | |
|---|---|---|---|---|
| 6,204,674 B1* | 3/2001 | Dabrowiecki | ........... | G01R 3/00 324/750.25 |
| 2006/0001437 A1* | 1/2006 | Kister | ................ | G01R 1/07314 324/755.05 |
| 2008/0238408 A1* | 10/2008 | McQuade | .......... | G01R 1/06738 324/149 |
| 2008/0238452 A1* | 10/2008 | McQuade | ............ | G01R 1/0675 324/755.01 |
| 2011/0169515 A1* | 7/2011 | Nielsen | .............. | G01R 1/07392 324/750.16 |

(Continued)

*Primary Examiner* — Huy Q Phan
*Assistant Examiner* — Raul J Rios Russo
(74) *Attorney, Agent, or Firm* — Antony P. Ng; Russell Ng PLLC

(57) ABSTRACT

A probe card is disclosed. The probe card includes a first disc, a second disc, an alignment plate and multiple micro probes. One of the micro probes includes a linear segment and a curved segment connected to each other at an angle stop. The first disc includes a recessed area having multiple holes formed therein, wherein one of the holes is configured to receive the linear segment of the micro probe. The second disc includes a recessed area having multiple holes formed therein, wherein one of the holes is configured to receive the curved segment of the micro probe. Placed within the recessed area of the second disc, the alignment plate includes multiple holes formed therein, wherein one of the holes is configured to receive the curved segment of the micro probe.

12 Claims, 5 Drawing Sheets

(56) References Cited

U.S. PATENT DOCUMENTS

2015/0369842 A1* 12/2015 McQuade .......... G01R 1/07371
324/756.03

* cited by examiner

PROBE CARD FOR TESTING SEMICONDUCTOR WAFERS

BACKGROUND OF THE INVENTION

1. Technical Field

The present invention relates to probe assemblies in general, and in particular to a probe card capable of electrically connecting a semiconductor wafer to a tester for the purpose of testing the semiconductor wafer.

2. Description of Related Art

When performing a wafer level test, a probe card containing multiple conductive micro probes is brought into contact with a chip located on a semiconductor wafer. The micro probes then transfer various test signals generated by a tester to various contact pads on integrated circuits within the chip.

As the density of contact pads on integrated circuits increases, it would be desirable to provide an improved method and apparatus to allow conductive micro probes on a probe card to be closer to each other.

SUMMARY OF THE INVENTION

In accordance with a preferred embodiment of the present invention, a probe card includes a first disc, a second disc, an alignment plate and multiple micro probes. One of the micro probes includes a linear segment and a curved segment connected to each, other at an angle stop. The first disc includes a recessed area having multiple holes formed therein, wherein one of the holes is configured to receive the linear segment of the micro probe. The second disc includes a recessed area having multiple holes formed therein, wherein one of the holes is configured to receive the curved segment of the micro probe. Placed within the recessed area of the second disc, the alignment plate includes multiple holes formed therein, wherein one of the holes is configured to receive the curved segment of the micro probe.

All features and advantages of the present invention will become apparent is in the following detailed, written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
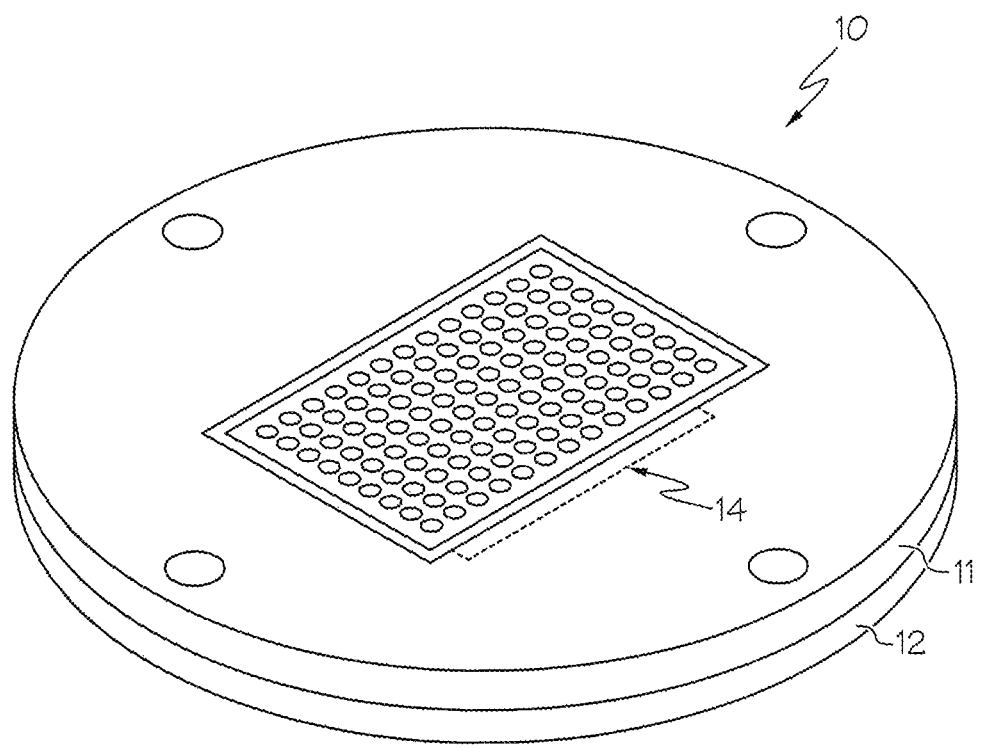
FIG. 1 is an isometric view of a probe card, in which a preferred embodiment of the present invention is incorporated.

Referring now to the drawings and in particular to FIG. 1, there is depicted an isometric view of a probe card, in which a preferred embodiment of the present invention is incorporated. As shown, a probe card 10 includes a top disc 11, a bottom disc 12 and an alignment plate 14. Probe card 10 is designed for vertical probe technology in which micro probes stand up vertically over a contact site (instead of approaching a contact a site at an angle). Top disc 11, bottom disc 12 and alignment plate 14 contain patterns of holes that correspond to the positions of contact pads located on an integrated circuit device to be tested. Top disc 11, bottom disc 12 and alignment plate 14 are preferably made of ceramic.

Figure 2A:
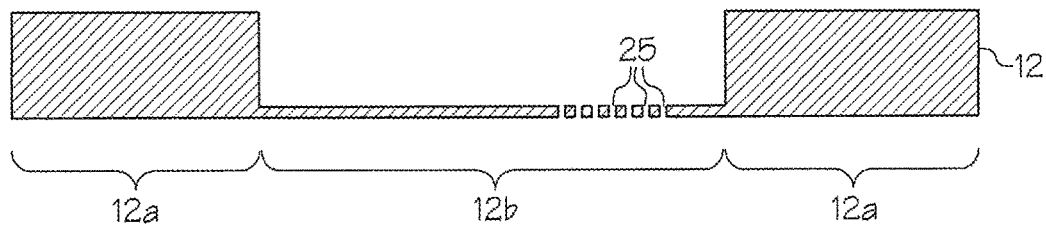
FIGS. 2A-2C illustrates a method for making the probe card from FIG. 1.
Figure 2B:
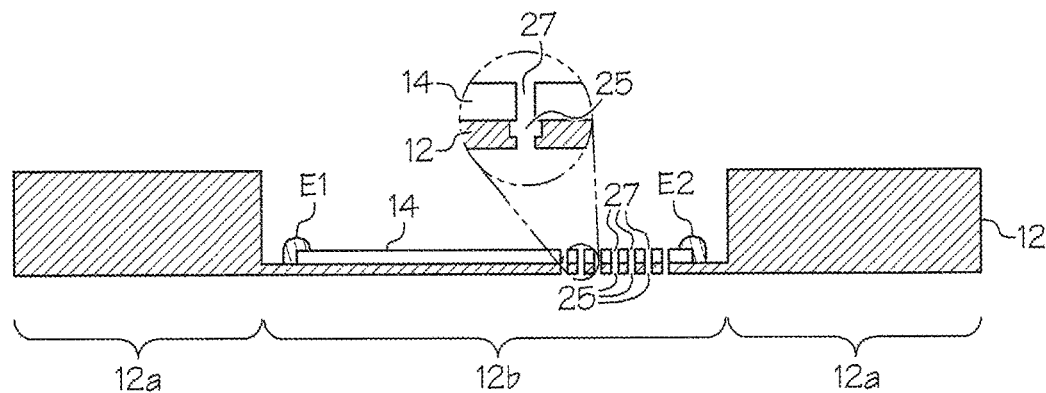
Figure 2C:
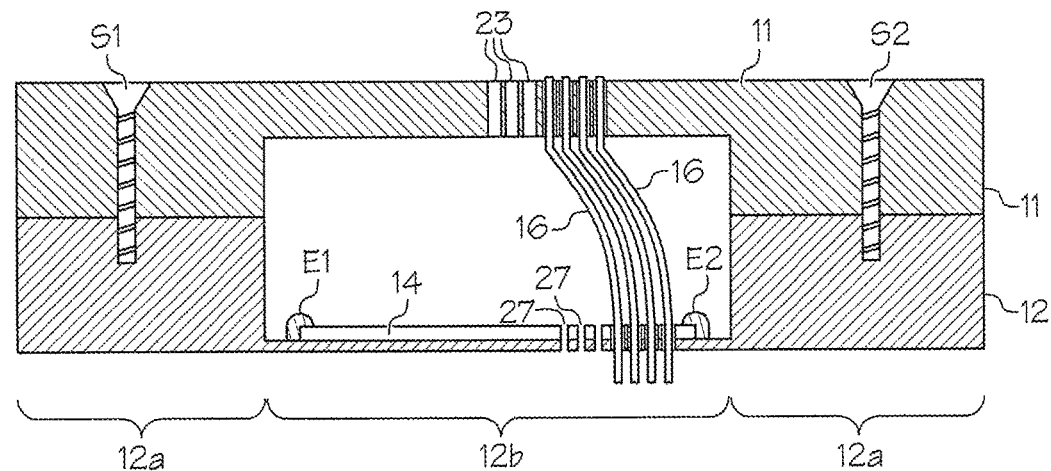

With reference now to FIGS. 2A-2C, there are illustrated a method for making probe card 10. Bottom disc 12, which includes a solid area 12a and a recessed area 12b, is provided, and multiple pilot holes 25 are initially drilled through recessed area 12b, as shown in FIG. 2A. Preferably, solid area 12a is approximately 60 mil thick, and recessed area 12b is approximately 21 mil thick.

Next, alignment plate 14 is placed within recessed area 12b. After alignment plate 14 has been secured within recessed area 12b by, for example, epoxy glue, at locations E1, E2, multiple holes 27 are then drilled through alignment plate 14, as depicted in FIG. 2B. Pilot holes 25 may have different diameters on the top and bottom surfaces of bottom disc 12. For example, the diameter of pilot hole 25 is larger on the top surface of bottom disc 12 than the diameter of same pilot hole 25 on the bottom surface of bottom disc 12, and the diameter of holes 27 in alignment plate 14 is the same as the diameter of pilot hole 25 on the bottom surface of bottom disc 12, as illustrated in the enlarged view of hole 27 and hole 25 in FIG. 2B. Holes 27 in alignment plate 14 should align with pilot holes 25 in recessed area 12b of bottom disc 12.

Preferably, alignment plate 14 is approximately 16 mil thick. Together with recessed area 12b of disc 12, the total length of holes 25 and 27 combined is approximately 37 mil, which allows for smooth guiding of micro probes 16.

The method of the present invention for drilling holes 25 and 27 allows the vertical distance for guiding micro probes 16 to be extended beyond the current industry standard that is less than 30 mil.

Top disc 11, which includes multiple holes 23 in a recessed area, is placed on top of bottom disc 12. Top disc 11 may be removably fixed to an upper surface of solid area 12a of bottom disc 12 via screws S1 and S2. As shown in FIG. 2C, holes 23 in top plate 11 are configured to receive the linear segment of micro probes 16 for providing electrical contacts to a tester (not shown). On the other hand, holes 27 in alignment plate 14 and pilot holes 25 in bottom disc 12 are configured to receive the curved segment of micro probes 16 for providing electrical contacts to a device under test (not shown).

Figure 3:
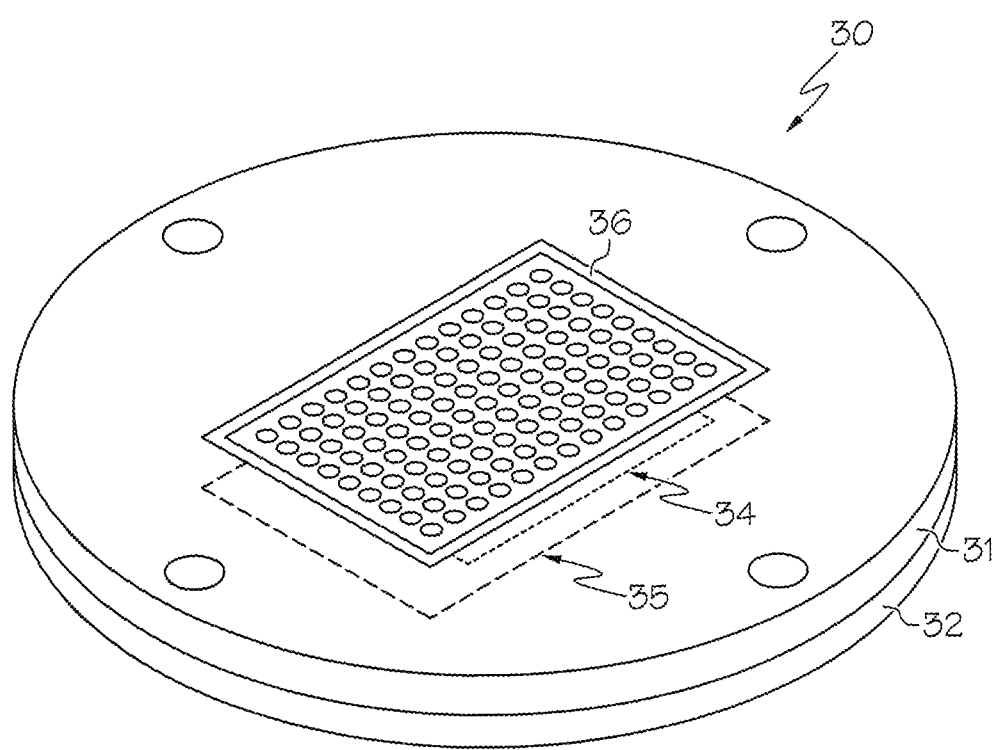
FIG. 3 is an isometric view of a probe card, in which an alternative embodiment of the present invention is incorporated.

Referring now FIG. 3, there is depicted an isometric view of a probe card, in which an alternative embodiment of the present invention is incorporated. As shown, a probe card 30 includes a top disc 31, a bottom disc 32, a first alignment plate 34, a second alignment plate 35 and a third alignment plate 36. Probe card 30 is designed for vertical probe technology in which micro probes stand up vertically over a contact site. First disc 31, second disc 32 and alignment plates 34-36 contain patterns of holes that correspond to the positions of contact pads located on an integrated circuit device to be tested. Top disc 31 and bottom disc 32 are preferably made of stainless steel.

Figure 4A:
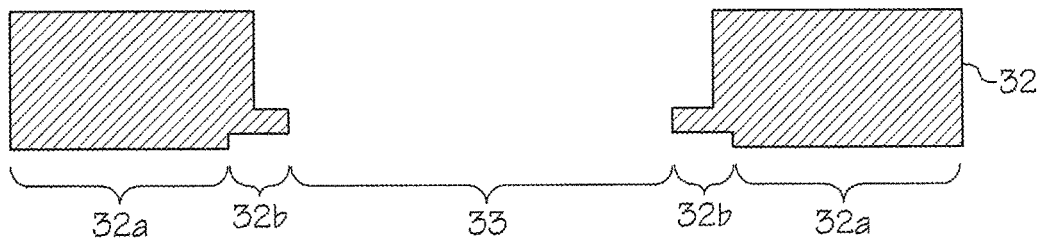
FIGS. 4A-4C illustrates a method for making the probe card from FIG. 3.
Figure 4B:
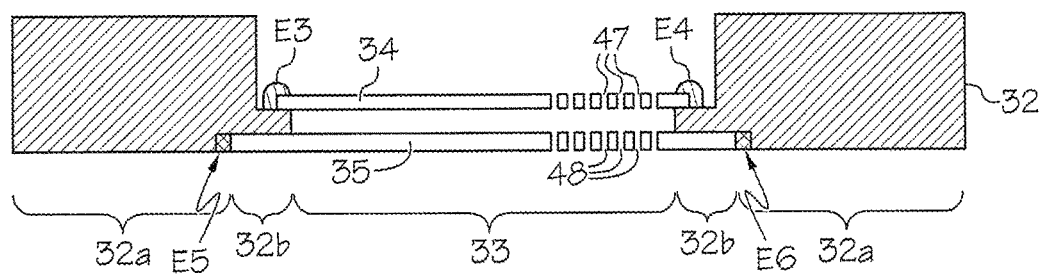
Figure 4C:
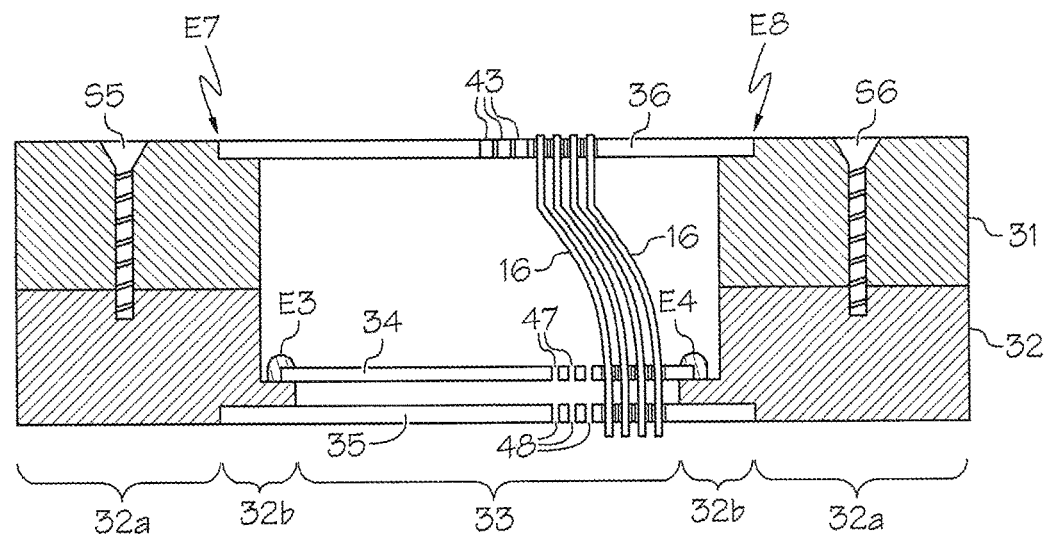

With reference now to FIGS. 4A-4C, there are illustrated a method for making probe card 30. Bottom disc 32, which includes a solid area 32a, a recessed area 32b and an opening 33, is initially provided, as shown in FIG. 4A. Preferably, solid area 32a is approximately 60 mil thick, and recessed area 32b is approximately 10 mil thick.

Next, first alignment plate 34 having multiple holes 47 is placed on top of recessed area 32b. First alignment plate 34 can be secured to recessed area 32b by, for example, epoxy glue, at locations E3, E4. Second alignment plate 35 having multiple holes 48 is placed underneath recessed area 32b of bottom disc 32. Preferably, second alignment plate 35 having multiple holes 48 can be secured to recessed area 32b of bottom disc 32 via epoxy glue at locations E5, E6, as shown in FIG. 4B. Holes 47 in first alignment plate 34 should align with holes 48 in second alignment plate 35.

Top disc 31, which includes an opening in the middle, is placed on top of bottom disc 32. Top plate 31 may be removably fixed to an upper surface of solid area 32a of bottom disc 32 via screws S5 and S6. Third alignment plate 36 having multiple holes 43 is placed on top of a recessed area of top disc 31. Third alignment plate 36 can be secured to the recessed area of top disc 31 by, for example, epoxy glue at locations E7, E8.

Preferably, alignment plates 34-36 are approximately 10 mil thick. Alignment plates 34-36 are preferably made of silicon nitrate. Holes 47 in first alignment plate 34, holes 48 in second alignment plate 35, and holes 43 in third alignment plate 36 can be separately drilled via laser before being placed within discs 31-32. The distance between alignment plates 34 and 35 is preferably 10 mil, but it can be extended to allows for smooth guiding of micro probes 16.

As shown in FIG. 4C, holes 43 are configured to receive the linear segment of micro probes 16 for providing electrical contacts to a tester (not shown). On the other hand, holes 47 in first alignment plate 34 and holes 48 in second alignment plate 35 are configured to receive the linear segment of micro probes 16 for providing electrical contacts to a device under test (not shown).

Figure 5:
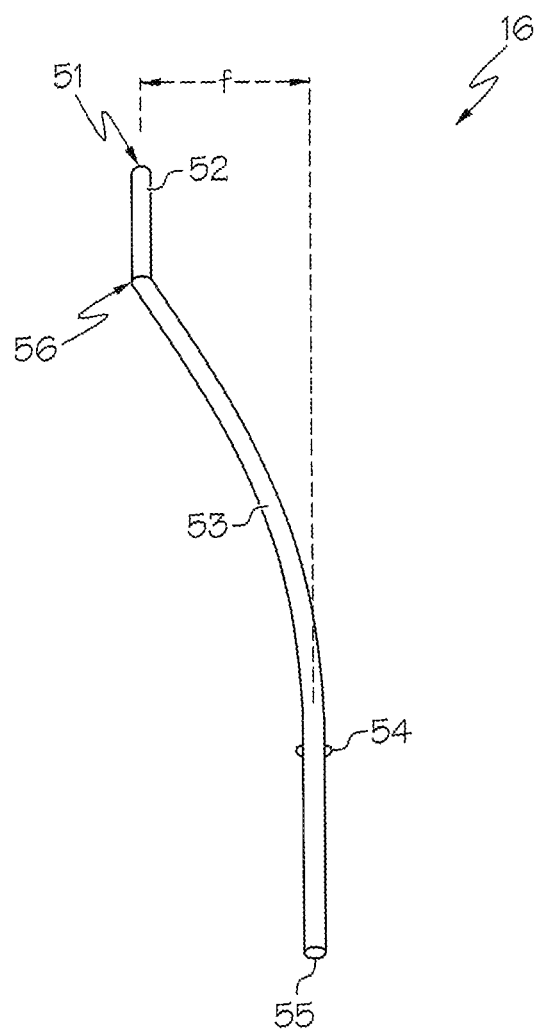
FIG. 5 shows one micro probe, in accordance with a preferred embodiment of the present invention.

Referring now to FIG. 5, there is illustrated an enlarged view of micro probe 16, in accordance with a preferred embodiment of the present invention. Micro probe 16 is preferably electroformed, such as a micro-electro-mechanical systems (MEMS) probe. Micro probe 16 includes a linear (straight) segment 52 and a curved segment 53, with curved segment 53 being longer than linear segment 52. Linear segment 52 terminates in a first contact tip 51. Curved segment 53 terminates in a second contact tip 55 that is offset a distance f from first contact tip 51. A portion of curved segment 53 is in a bowed shape curve, and a portion of curved segment 53 located between a probe stop 54 and second contact tip 55 is straight. Linear segment 52 meets curved segment 53 to form an angle stop 56. Probe stop 54 may be used to provide a lower insertion stop when micro probe 16 is placed in, for example, hole 27 of alignment plate 14 (from FIG. 2C) or hole 47 of first alignment plate 34 (from FIG. 4C).

Preferably, first contact tip 51 is configured to provide electrical contact to electronic test circuitry of a tester, and second contact tip 55 is configured to provide electrical contact to a contact pad located on an integrated circuit. First and second contact tips 51, 55 can be any shape, such as flat, cone shaped, or rounded.

As has been described, the present invention provides an improved probe card for testing integrated circuits.

While the invention has been particularly shown and described with reference to a preferred embodiment, it will be understood by those skilled in the art that various changes in form and detail may be made therein without departing from the spirit and scope of the invention.

What is claimed is:

1. A probe card comprising:
   a plurality of micro probes, wherein one of said micro probes includes a linear segment and a curved segment connected to each other at an angle stop, wherein said linear segment is shorter than said curved segment, wherein said linear segment includes a first contact tip to provide electrical contact to an electronic test circuitry, wherein said curved segment includes a second contact tip to provide electrical contact to a solder bump on a semiconductor wafer;
   a first disc having a recessed area with a plurality of holes formed therein, wherein one of said holes receives said linear segment of said one micro probe;
   a second disc having a recessed area with a plurality of holes formed therein, wherein one of said holes receives said curved segment of said one micro probe, wherein said second disc is secured to said first disc; and
   an alignment plate placed within said recessed area of said second disc, wherein said alignment plate includes a plurality of holes formed therein, wherein one of said holes receives said curved segment of said one micro probe.

2. The probe card of claim 1, wherein said first disc is made of ceramic.

3. The probe card of claim 1, wherein said second disc is made of ceramic.

4. The probe card of claim 1, wherein said alignment plate is made of ceramic.

5. The probe card of claim 1, wherein said alignment plate is secured to said recessed area of said second disc via epoxy glue.

6. A probe card comprising:
   a plurality of micro probes, wherein one of said micro probes includes a linear segment and a curved segment connected to each other at an angle stop, wherein said linear segment is shorter than said curved segment;
   a first disc having a recessed area;
   a first alignment plate placed on a first surface of said recessed area of said first disc, wherein said first alignment plate includes a plurality of holes formed therein, wherein one of said holes is configured to receive said curved segment of said one micro probe;
   a second alignment plate placed on a second surface of said recessed area of said first disc, wherein said second alignment plate includes a plurality of holes formed therein, wherein one of said holes is configured to receive said curved segment of said one micro probe;
   a second disc having a recessed area, wherein said second disc is secured to said first disc; and
   a third alignment plate placed on said recessed area of said second disc, wherein said third alignment plate includes a plurality of holes formed therein, wherein one of said holes is configured to receive a linear segment of said one micro probe.

7. The probe card of claim 6, wherein said linear segment includes a first contact tip configured to provide electrical contact to an electronic test circuitry, wherein said curved segment includes a second contact tip configured to provide electrical contact to a solder bump on a semiconductor wafer.

8. The probe card of claim 6, wherein said first disc is made of stainless steel.

9. The probe card of claim 6, wherein said second disc is made of stainless steel.

10. The probe card of claim 6, wherein said alignment plates are made of silicon nitrate.

11. The probe card of claim 1, wherein the diameter of said one hole in said alignment plate is smaller than the diameter of said one hole in said first disc.

12. The probe card of claim 1, wherein the cross-section of said one hole in said first disc is in a T-shape.

* * * * *